(12) United States Patent
Wang et al.

(10) Patent No.: US 8,878,152 B2
(45) Date of Patent: Nov. 4, 2014

(54) NONVOLATILE RESISTIVE MEMORY ELEMENT WITH AN INTEGRATED OXYGEN ISOLATION STRUCTURE

(75) Inventors: Yun Wang, San Jose, CA (US); Tony P. Chiang, Campbell, CA (US); Imran Hashim, Saratoga, CA (US); Dipankar Pramanik, Saratoga, CA (US)

(73) Assignees: Intermolecular, Inc., San Jose, CA (US); Kabushiki Kaisha Toshiba, Tokyo (JP); SanDisk 3D LLC, Milpitas, CA (US)

( * ) Notice: Subject to any disclaimer, the term of this patent is extended or adjusted under 35 U.S.C. 154(b) by 59 days.

(21) Appl. No.: 13/408,103

(22) Filed: Feb. 29, 2012

(65) Prior Publication Data

US 2013/0221307 A1 Aug. 29, 2013

(51) Int. Cl.
*H01L 29/02* (2006.01)

(52) U.S. Cl.
USPC .......... 257/2; 257/4; 257/5; 257/532; 257/24; 257/314; 438/382; 438/384

(58) Field of Classification Search
CPC ....... H01L 45/146; H01L 45/08; H01L 45/06; H01L 45/12; H01L 45/1675; H01L 45/1233; H01L 45/2463; H01L 27/2463
USPC ......... 257/2, 4, 5, 532, 24, 314; 438/382, 384
See application file for complete search history.

(56) References Cited

U.S. PATENT DOCUMENTS

| | | | |
|---|---|---|---|
| 6,830,983 B2 | 12/2004 | Marsh | |
| 7,157,783 B2 | 1/2007 | Marsh | |
| 7,538,338 B2 | 5/2009 | Rinerson | |
| 8,420,478 B2 | 4/2013 | Chiang | |
| 2003/0128483 A1* | 7/2003 | Kamijo | 360/324.11 |
| 2003/0179617 A1* | 9/2003 | Gudesen et al. | 365/200 |
| 2004/0043578 A1 | 3/2004 | Marsh | |
| 2004/0159828 A1* | 8/2004 | Rinerson et al. | 257/2 |
| 2009/0283736 A1* | 11/2009 | Kanzawa et al. | 257/2 |
| 2009/0303780 A1 | 12/2009 | Kasko | |
| 2010/0012912 A1* | 1/2010 | Schricker | 257/2 |
| 2010/0258782 A1* | 10/2010 | Kuse et al. | 257/4 |
| 2010/0308298 A1* | 12/2010 | Ninomiya et al. | 257/5 |
| 2013/0122680 A1* | 5/2013 | Jo | 438/382 |

OTHER PUBLICATIONS

Smyth; The defect chemistry or metal oxides; Jan. 1, 2000; Z—Book-Author; Chapters 15 8 9 and 12 pp. 174 118161 and 217237.

Park, Jae-Wan., et al.; Influence of Oxygen Content on Electrical Properties of NiO Films Grown by Rf Reactive Sputtering for Resistive RandomAccess Memory Applications; Jan. 1, 2006; Academia—Hanyang University; Journal of Vacuum Science and Technology A. 23 5m oo 22052208.

(Continued)

*Primary Examiner* — Fernando L Toledo
*Assistant Examiner* — Mohammed Shamsuzzaman

(57) ABSTRACT

A nonvolatile resistive memory element includes one or more novel oxygen isolation structures that protect the resistive switching material of the memory element from oxygen migration. One such oxygen isolation structure comprises an oxygen barrier layer that isolates the resistive switching material from other portions of the resistive memory device during fabrication and/or operation of the memory device. Another such oxygen isolation structure comprises a sacrificial layer that reacts with unwanted oxygen migrating toward the resistive switching material during fabrication and/or operation of the memory device.

13 Claims, 7 Drawing Sheets

(56) References Cited

OTHER PUBLICATIONS

Scott, D.M., et al.; Implanted Oxygen in NiSi Formation; Jan. 1, 1981; California Institute of Technology; Phys. State.Sol a 66 773778.

Xiong, K., et al.; Passivation of Oxygen Vacancy States in HfO2 by Nitroggen; Jan. 1, 2006; Cambridge University; Journal of Applied Physics pp. 99101.

Grubbs, Melody et al.; Development and characterization of high temperature stable TaWSiC amorphous metal gates; Jan. 1, 2010; Applied Physics; Applied Physics letters 97.

* cited by examiner

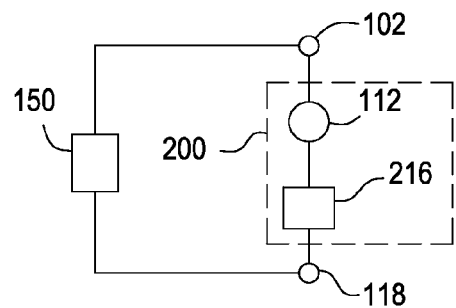
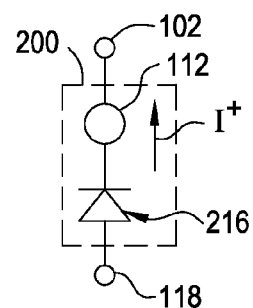
FIG. 2A  FIG. 2B
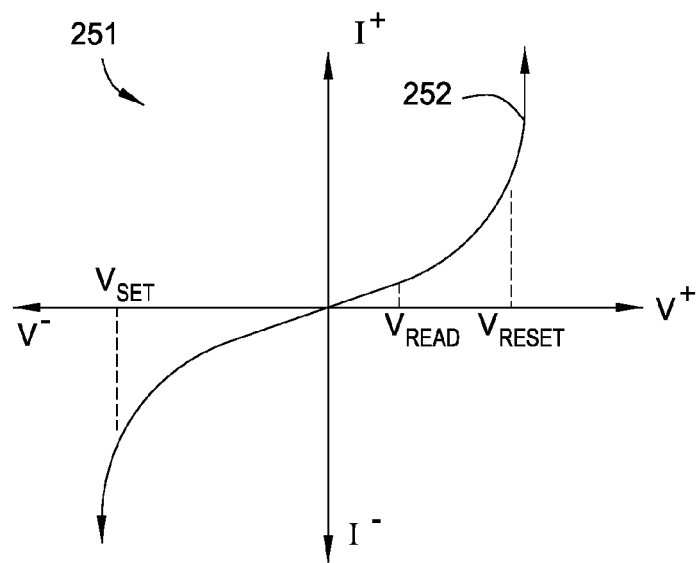
FIG. 3

NONVOLATILE RESISTIVE MEMORY ELEMENT WITH AN INTEGRATED OXYGEN ISOLATION STRUCTURE

BACKGROUND

1. Field of the Invention

This invention relates to nonvolatile resistive memory elements, and more particularly, to a nonvolatile resistive memory element with an integrated oxygen isolation structure and methods for forming the same.

2. Description of the Related Art

Nonvolatile memory elements are used in devices requiring persistent data storage, such as digital cameras and digital music players, as well as in computer systems. Electrically-erasable programmable read only memory (EPROM) and NAND flash are nonvolatile memory technologies currently in use. However, as device dimensions shrink, scaling issues pose challenges for traditional nonvolatile memory technology. This has led to the investigation of alternative nonvolatile memory technologies, including resistive switching nonvolatile memory.

Resistive switching nonvolatile memory is formed using memory elements that are bistable, i.e., having two stable states with different resistances. A bistable memory element can be placed in a high resistance state or a low resistance state by application of suitable voltages or currents. Voltage pulses are typically used to switch the bistable memory element from one resistance state to the other. Subsequently, nondestructive read operations can be performed on the memory element to ascertain the value of a data bit that is stored therein.

In the materials that make up a bistable memory element, oxygen vacancies and the movement thereof are believed to be the primary mechanism of the "on" and "off" states of resistive switching memory devices. Furthermore, it is known that such oxygen vacancies can be eliminated or otherwise affected by the migration of even a small number of mobile oxygen ions into the memory element, either during fabrication or operation of the memory device.

As resistive switching memory device sizes shrink, it is important to reduce the required currents and voltages that are necessary to reliably set, reset and/or determine the desired "on" and "off" states of the device, thereby minimizing power consumption of the device, resistive heating of the device, and cross-talk between adjacent devices. In addition, reliable retention of data by such devices for longer periods is highly desirable.

Because a bistable memory element formed with relatively few oxygen vacancies formed therein can result in lower operating voltages and currents, it is generally desirable to minimize the number of oxygen vacancies formed in bistable memory elements. However, such bistable memory elements are more sensitive to oxygen migration during fabrication and/or operation, since the migration of even a very small number of mobile oxygen ions into such memory elements can significantly alter the performance and longevity of the memory element. Thus, there is a trade-off in the design of resistive bistable memory elements between those configurations having lower operating voltages and currents, which benefit from having fewer oxygen vacancies, and those configurations having higher endurance and reliability, which benefit from having more oxygen vacancies.

In light of the above, there is a need in the art for nonvolatile resistive switching memory devices having reduced current and voltage requirements that are less sensitive to oxygen migration.

SUMMARY

One or more embodiments of the present invention set forth a nonvolatile resistive memory element having one or more novel oxygen isolation structures and methods of forming the same.

According to one embodiment of the present invention, a nonvolatile memory element comprises a first layer operable as an electrode layer and formed above a substrate, a second layer operable as a variable resistance layer and disposed between the first layer and a third layer operable as an electrode layer, and a fourth layer that is operable as an oxygen barrier layer disposed adjacent to one or more of the first layer, the second layer, and the third layer, wherein the fourth layer comprises a material having an amorphous structure.

According to another embodiment of the present invention, a nonvolatile memory element comprises a first layer operable as an electrode layer and formed above a substrate, a second layer operable as a variable resistance layer and disposed between the first layer and a third layer operable as an electrode layer, and a fourth layer that is operable as an oxygen barrier layer and is disposed on a sidewall of the second layer, wherein the fourth layer comprises a material having an amorphous structure.

According to another embodiment of the present invention, a nonvolatile memory element comprises a first layer operable as an electrode layer and formed above a substrate, a second layer operable as a variable resistance layer and disposed between the first layer and a third layer operable as an electrode layer, and a fourth layer that is operable as a sacrificial layer, disposed adjacent to one or more of the first layer, the second layer, and the third layer, wherein the fourth layer comprises a material that is more reactive with oxygen than a material in the second layer.

BRIEF DESCRIPTION OF THE DRAWINGS

So that the manner in which the above recited features of embodiments of the invention can be understood in detail, a more particular description of embodiments of the invention, briefly summarized above, may be had by reference to the appended drawings. It is to be noted, however, that the appended drawings illustrate only typical embodiments of this invention and are therefore not to be considered limiting of its scope, for the invention may admit to other equally effective embodiments.

FIG. 2A is a schematic cross-sectional view of a memory device, configured in accordance with an embodiment of the invention.

FIG. 2B schematically illustrates a memory device configured to allow current to flow through the memory device in a forward direction, according to embodiments of the invention.

FIG. 3 sets forth a log-log plot of current versus voltage of a bipolar switching curve for one embodiment of a memory element, according to an embodiment of the invention.

For clarity, identical reference numbers have been used, where applicable, to designate identical elements that are common between figures. It is contemplated that features of one embodiment may be incorporated in other embodiments without further recitation.

DETAILED DESCRIPTION

Embodiments of the invention set forth a nonvolatile resistive memory device having one or more novel oxygen isolation structures and methods of forming the same. One such oxygen isolation structure may be an oxygen barrier layer that isolates the resistive switching material of the nonvolatile memory element from other portions of the resistive memory device during fabrication and/or operation of the memory device. Specifically, the oxygen barrier layer encapsulates the regions of one or of the memory elements to prevent the depletion of oxygen vacancies from such element. Another such oxygen isolation structure may be a sacrificial layer that reacts with unwanted oxygen migrating toward a memory element of the resistive memory device during fabrication and/or operation of the memory device. The sacrificial layer comprises a material that reacts with oxygen present in the memory element in order to maintain or increase the oxygen vacancies in such element. Use of the oxygen barrier layer and/or sacrificial layer improves performance and longevity of the nonvolatile resistive memory element by preserving the defects in the resistive switching material, such as oxygen vacancies, that are responsible for the switching capability of the resistive switching material.

Figure 1:
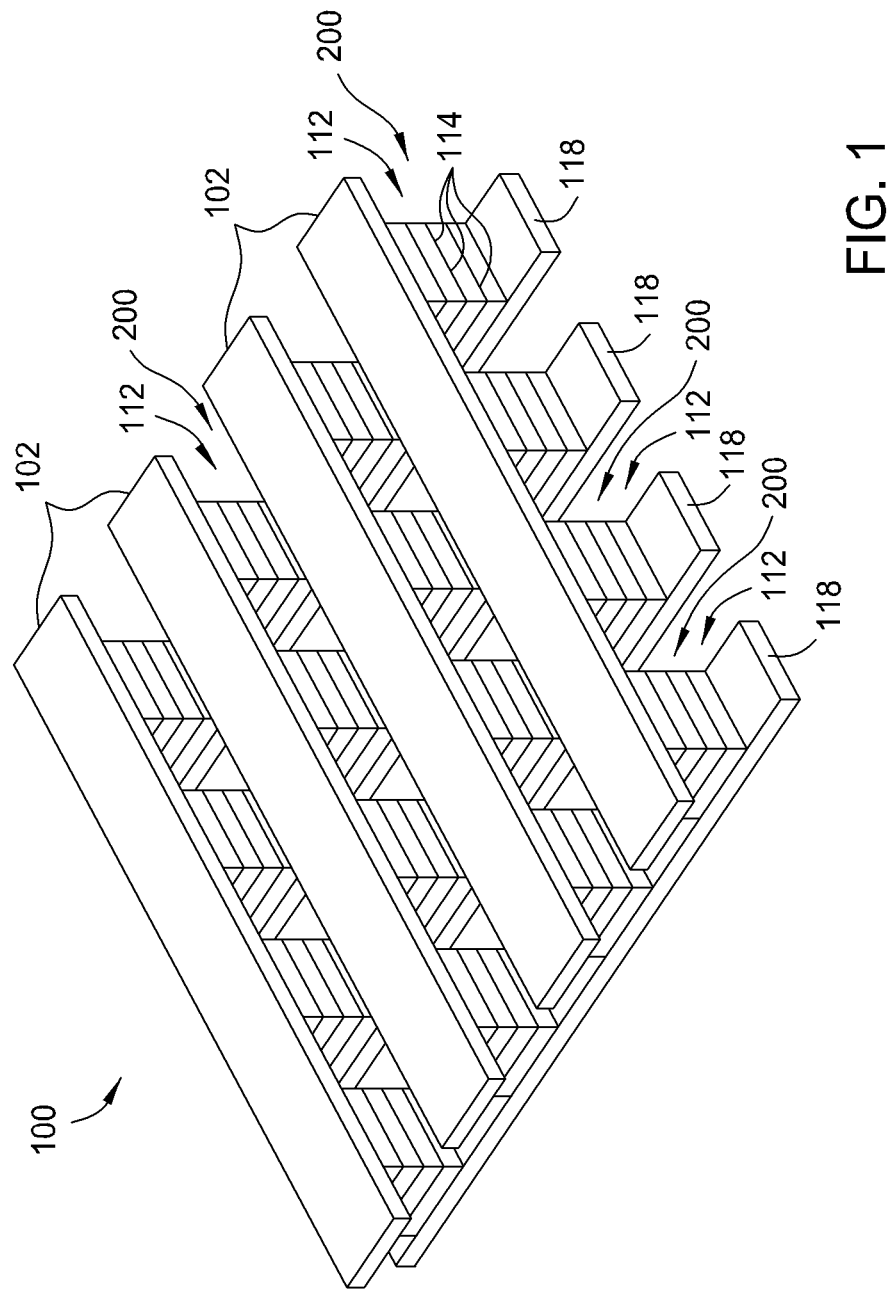
FIG. 1 is a perspective view of a memory array of memory devices, configured according to embodiments of the invention.

FIG. 1 is a perspective view of a memory array 100 of memory devices 200, configured according to embodiments of the invention. Memory array 100 may be part of a larger memory device or other integrated circuit structure, such as a system-on-a-chip type device. Memory array 100 may be formed as part of a high-capacity nonvolatile memory integrated circuit, which can be used in various electronic devices, such as digital cameras, mobile telephones, handheld computers, and music players. For clarity, memory array 100 is illustrated as a single layer memory array structure. However, memory arrays such as memory array 100 can also be stacked in a vertical fashion to make multilayer memory array structures.

Each of memory devices 200 comprises a nonvolatile resistive switching memory device, such as a resistive random access memory (ReRAM) device. Memory device includes a memory element 112, one or more novel oxygen isolation structures, and in some embodiments a current steering device. Embodiments of oxygen isolation structures are described below in conjunction with FIGS. 4-6, and embodiments of a current steering device are described below in conjunction with FIGS. 2A, 2B. As shown in FIG. 1, memory elements 112 in memory devices 200 may be formed from one or more material layers 114, which are described below in conjunction with FIG. 4.

Read and write circuitry (not shown) is connected to memory devices 200 using bit line electrodes 102 and orthogonally positioned word line electrodes 118. Bit line electrodes 102 and word line electrodes 118 are sometimes referred to as "bit lines" and "word lines," and are used to read and write data into memory elements 112 in memory devices 200. Individual memory devices 200 or groups of memory devices 200 can be addressed using appropriate sets of bit line electrodes 102 and word line electrodes 118. In the embodiment illustrated in FIG. 1, bit line electrodes 102 are disposed above memory elements 112 and word line electrodes 118 are disposed below memory elements 112. In other embodiments, bit line electrodes may be disposed below memory elements 112 and word line electrodes may be disposed above memory elements 112.

FIG. 2A is a schematic diagram of a memory device 200 configured in accordance with an embodiment of the invention. Memory device 200 includes memory element 112 and in some embodiments current steering device 216, which are both disposed between bit line electrodes 102 and word line electrodes 118. In one embodiment, current steering device 216 comprises an intervening electrical component, such as a p-n junction diode, p-i-n diode, transistor, or other similar device that is disposed between bit line electrode 102 and memory element 112, or between word line electrode 118 and memory element 112. In some embodiments, current steering device 216 may include two or more layers of semiconductor material, such as two or more doped silicon layers, that are configured to allow or inhibit the current flow in different directions through the memory element 112. In addition, read and write circuitry 150 is coupled to memory device 200 via bit line electrodes 102 and word line electrodes 118 as shown. Read and write circuitry 150 is configured to both sense the resistance state and set the resistance state of memory device 200.

FIG. 2B schematically illustrates memory device 200 configured to allow current to flow through memory device 200 in a forward direction ("$I^+$"), according to embodiments of the invention. However, due to the design of current steering device 216, a reduced current can also flow in the opposing direction through the device by the application of a reverse bias to the bit line electrodes 102 and word line electrodes 118.

During a read operation, read and write circuitry 150 applies a read voltage $V_{READ}$, e.g., +0.5 volts (V), across resistive switching memory element 112 using an appropriately selected bit line electrode 102 and word line electrode 118 in memory array 100. Read and write circuitry 150 then senses the resultant current passing through memory device 200. A relatively high "on" current value ($I_{ON}$) indicates that memory element 112 is in its low resistance state, and a relatively low "off" current value ($I_{OFF}$) indicates that memory element 112 is in its high resistance state. Depending on its history, the particular memory element 112 that is addressed in this way may be in either a high resistance state (HRS) or a low resistance state (LRS). The resistance of memory element 112 therefore determines what digital data is being stored therein. For example, if memory element 112 is in the high resistance state, memory element 112 may be said to contain a logical zero (i.e., a "0" bit). If, on the other hand, memory element 112 is in the low resistance state, memory element 112 may be said to contain a logical one (i.e., a "1" bit).

During a write operation, the resistive state of a particular memory element 112 in memory array 100 is changed by application of suitable write signals to an appropriate set of bit line electrodes 102 and word line electrodes 118 by read and write circuitry 150. In some embodiments, to affect such a change, bipolar switching is used, where opposite polarity set and reset voltages are used to alter the resistance of a selected memory element 112 between high and low resistance states. FIG. 3 sets forth a log-log plot 251 of current (I) versus voltage (V) of a bipolar switching curve 252 for one embodiment of memory element 112, and thus illustrates typical threshold values used to set and reset the contents of memory element 112. For example, memory element 112 may initially be in a high resistance state (e.g., storing a logical "zero"). To store a logical "one" in memory element 112, memory element 112 is placed into its low-resistance state. This may be accomplished by using read and write circuitry 150 to apply a set voltage $V_{SET}$ (e.g., −2 V to −4 V) across bit line electrodes 102 and word line electrodes 118. In one embodiment, applying a negative $V_{SET}$ voltage to memory element 112 causes memory element 112 to switch to its low resistance state. In this region, the memory element 112 is changed so that, following removal of the set voltage $V_{SET}$, memory element 112 is characterized by a low resistance state. Conversely, to store a logical "zero" in memory element 112, the memory element can once again be placed in its high resistance state by applying a positive reset voltage $V_{RESET}$ (e.g., +2 V to +5 V) to memory element 112. When read and write circuitry 150 applies $V_{RESET}$ to memory element 112, memory element 112 enters its high resistance state. When reset voltage $V_{RESET}$ is removed from memory element 112, memory element 112 will once again be characterized by high resistance when read voltage $V_{READ}$ is applied. While the discussion of the memory element 112 herein primarily provides bipolar switching examples, some embodiments of the memory elements 112 may use unipolar switching, where the set and reset voltages have the same polarity, without deviating from the scope of the invention described herein.

It is believed that the change in the resistive state of the memory element 112 may be "trap-mediated," i.e., due to the redistribution or filling of traps or defects in a variable resistance layer of memory element 112 when memory device 200 is reverse biased. The defects or traps, which are commonly believed to be oxygen vacancies, are formed during the deposition and/or post-processing of the variable resistance layer. For example, oxygen vacancies are likely created by a nonstoichiometric material composition of a host oxide material in the variable resistance layer. Embodiments of a variable resistance layer 206 are described below in conjunction with FIG. 4.

In an effort to prepare the memory element 112 for use, it is common to apply a forming voltage $V_{FORM}$ at least once across bit line electrodes 102 and word line electrodes 118 to "burn-in" each memory device 200 of memory array 100. It is believed that the application of forming voltage $V_{FORM}$, which is typically significantly greater than the $V_{RESET}$ and $V_{SET}$ voltages, causes the defects that are formed within variable resistance layer 206 during the device fabrication process to move, align and/or collect within various regions of the layer, causing variable resistance layer 206 to consistently and reliably switch between the "on" and "off" resistive states throughout the memory element's life. In one embodiment, forming voltage $V_{FORM}$ is between about 1 and about 5 times greater than the $V_{RESET}$ or $V_{SET}$ voltage. In one example, the forming voltage is between about 1.4 and about 2.5 times greater than the $V_{RESET}$ or $V_{SET}$ voltage. In one example, the forming voltage is between about 3 and about 7 volts. However, it is noted that in some cases it is desirable to form memory element 112 so that the application of a forming voltage is not required at all to assure that the device will perform as desired throughout its life.

Figure 4:
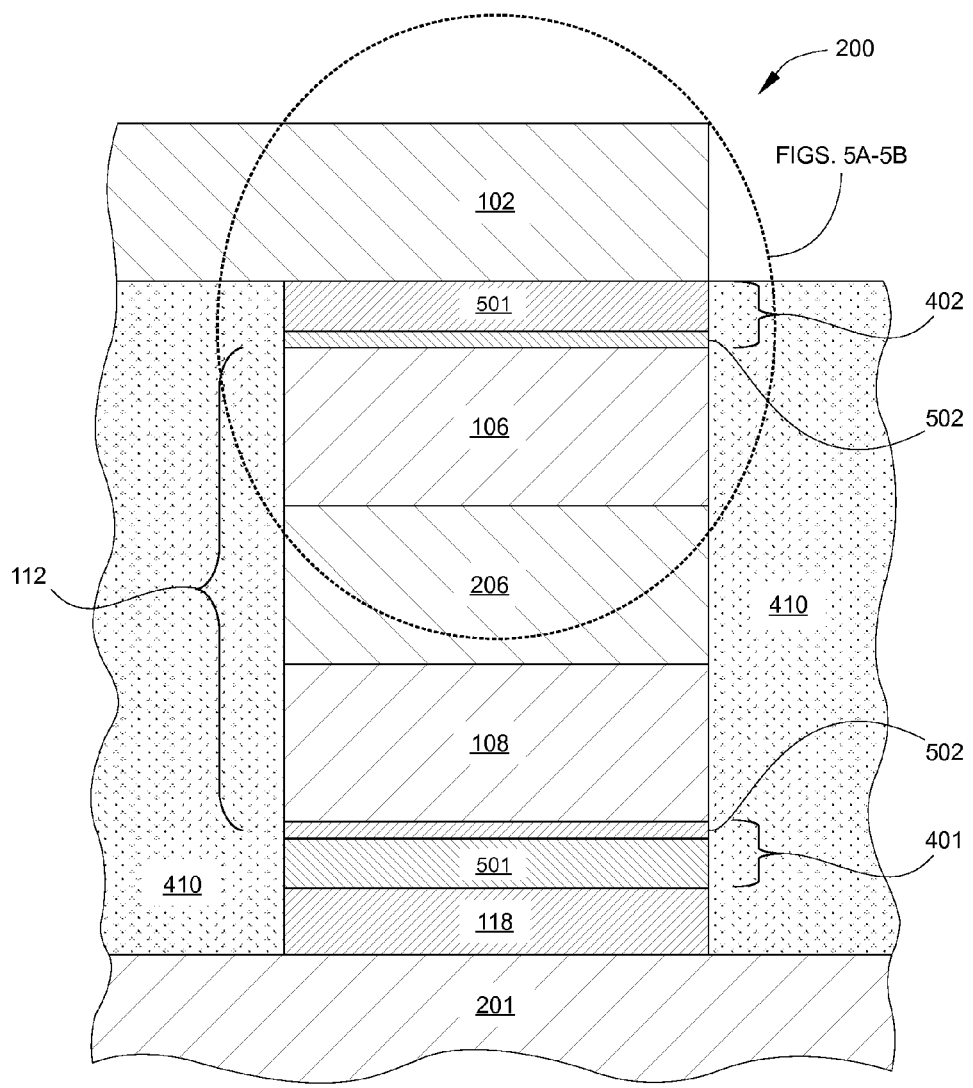
FIG. 4 is a schematic cross-sectional view of a memory device that has one or more integrated oxygen isolation structures and is formed from a series of deposited layers, according to an embodiment of the invention.

FIG. 4 is a schematic cross-sectional view of memory device 200 that has one or more integrated oxygen isolation structures and is formed from a series of deposited layers, according to embodiments of the invention. In the embodiment illustrated in FIG. 4, memory device 200 is formed over, or integrated with and disposed over, portions of a surface of a substrate 201 (e.g., a silicon substrate or an SOI substrate). It is noted that relative directional terms used herein with regard to embodiments of the invention are for purposes of description only, and do not limit the scope of the invention. Specifically, directional terms such as "over," "above," "under," and the like are used under the assumption that substrate 201 on which embodiments are formed is a "bottom" element and is therefore "under" elements of the invention formed thereon.

In the embodiment illustrated in FIG. 4, memory device 200 comprises a memory element 112 disposed between a bit line electrode 102 and a word line electrode 118 and surrounded by an electrically insulating material 410. Memory device 200 further includes a bottom oxygen isolation layer 401 and a top oxygen isolation layer 402 positioned below and above memory element 112 as shown. Memory element 112 is a nonvolatile resistive memory element that includes variable resistance layer 206 positioned between bottom electrode 108 and top electrode 106.

Variable resistance layer 206 comprises a bistable dielectric material that can be switched between two or more stable resistive states, thereby acting as the switching layer for memory element 112. Typically, variable resistance layer 206 is very thin, e.g., on the order of 15 to 30 Å. A variety of different materials may be suitable for use as variable resistance layer 206, including various oxides, nitrides, and all of the transition metals, i.e., hafnium (Hf), zirconium (Zr), titanium (Ti), tantalum (Ta), and the like. Generally, a material having a high bandgap energy, e.g., greater than 4 electron volts (eV), is desirable since high band gap variable resistance materials improve data retention and reduce the leakage current of memory element 112. Specifically, the amount of trapped charge in a variable resistance layer material with a high bandgap will be less than the amount of trapped charge in a variable resistance layer material with a lower band gap material. Also, the high band gap materials create a large barrier height that trapped charge carriers must cross during the read, set and reset operations. Examples of such high bandgap materials suitable for use in variable resistance layer 206 include hafnium oxide ($Hf_xO_y$), tantalum oxide ($Ta_xO_y$), aluminum oxide ($Al_xO_y$), lanthanum oxide ($La_xO_y$), yttrium oxide ($Y_xO_y$), dysprosium oxide ($Dy_xO_y$), ytterbium oxide ($Yb_xO_y$) and zirconium oxide ($Zr_xO_y$). Alternatively, lower bandgap metal oxide materials, such as titanium oxide ($TiO_x$), nickel oxide ($NiO_x$) or cerium oxide ($CeO_x$), may be used advantageously for some configurations of memory device 200. In some cases, a semiconductive metal oxide (p-type or n-type) such as zinc oxides ($Zn_xO_y$), copper oxides ($Cu_xO_y$), and their nonstoichiometric and doped variants can be used. In some embodiments, variable resistance layer 206 has a thickness of between about 10 and about 100 Å.

Bottom electrode 108 and top electrode 106 are formed from conductive materials that have a desirable work function tailored to the bandgap of the material making up variable resistance layer 206. In some configurations, bottom electrode 108 and top electrode 106 are formed from different materials, so that bottom electrode 108 and top electrode 106 have a work function that differs by a desired value, e.g., 0.1 eV, 0.5 eV, 1.0 eV, etc. For example, in one embodiment, in which a work function difference of about 0.3 eV is desired, top electrode 106 may be comprised of TiN, which has a work function of 4.5-4.6 eV, and bottom electrode 108 may be comprised of n-type polysilicon, which has a work function of approximately 4.1-4.15 eV. Many other electrode materials suitable for use in bottom electrode 108 and/or top electrode 106 include p-type polysilicon (4.9-5.3 eV), n-type polysilicon, transition metals, transition metal alloys, transition metal nitrides, transition metal carbides, tungsten (4.5-4.6 eV), tantalum nitride (4.7-4.8 eV), molybdenum nitride (4.0-5.0 eV), iridium (4.6-5.3 eV), and ruthenium (~4.7 eV). Other potential electrode materials include a titanium/aluminum alloys (4.1-4.3 eV), nickel (~5.0 eV), tungsten nitride (~4.3-5.0 eV), aluminum (4.2-4.3 eV), copper or silicon-doped aluminum (4.1-4.4 eV), copper (~4.5 eV), hafnium carbide (4.8-4.9 eV), hafnium nitride (4.7-4.8 eV), niobium nitride (~4.95 eV), tantalum carbide (approximately 5.1 eV), tantalum silicon nitride (~4.4 eV), titanium (4.1-4.4 eV), vanadium carbide (~5.15 eV), vanadium nitride (~5.15 eV), and zirconium nitride (~4.6 eV). In some embodiments, top electrode 106 is a metal, metal alloy, metal nitride or metal carbide formed from an element selected from a group of materials consisting of titanium (Ti), tungsten (W), tantalum (Ta), cobalt (Co), molybdenum (Mo), nickel (Ni), vanadium (V), hafnium (Hf) aluminum (Al), copper (Cu), platinum (Pt), palladium (Pd), iridium (Ir), ruthenium (Ru), and combinations thereof. In one embodiment, top electrode 106 comprises a metal alloy selected from the group of a titanium/aluminum alloy ($Ti_xAl_y$), or a silicon-doped aluminum (AlSi).

Bit line electrode 102 and word line electrode 118 are formed from conductive materials in order to couple memory devices 200 in memory array 100 to couple read and write circuitry 150 (shown in FIG. 2A). Conductive materials suitable for use in bit line electrode 102 and word line electrode 118 include those listed above for bottom electrode 108 and top electrode 106, although the work function of said materials is generally not a consideration. In embodiments in which no bottom oxygen isolation layer 401 is formed, word line electrode 118 and bottom electrode 108 may be formed from the same material and at the same time.

Bottom oxygen isolation layer 401 and top oxygen isolation layer 402 each comprise an oxygen barrier layer 501, a sacrificial layer 502, or a combination of both, according to embodiments of the invention. In some embodiments, memory device 200 may be configured with bottom oxygen isolation layer 401 and without top oxygen isolation layer 402, and in other embodiments, memory device 200 may be configured with top oxygen isolation layer 402 and without bottom oxygen isolation layer 401.

Oxygen barrier layer 501 is a material with a structure free of grain boundaries or other defects that can act as leakage paths for mobile oxygen and other unwanted ions into the nonvolatile memory element. Oxygen barrier layer 501 provides a physical barrier to the migration of mobile oxygen ions into memory element 112. Sacrificial layer 502 comprises a material that is more reactive with oxygen than the materials that make up variable resistance layer 206 or memory element 112, thereby acting as a reactive barrier to the migration of mobile oxygen ions into memory element 112. When used either separately or in combination in bottom oxygen-isolation layer 401 and top oxygen-isolation layer 402, oxygen barrier layer 501 and sacrificial layer 502 can significantly reduce migration of mobile oxygen ions into memory element 112 during fabrication and/or operation of memory device 200.

During fabrication of memory device 200, a number of device integration processes take place after the formation of memory element 112 that expose the partially formed memory device 200 to oxygen, either directly or indirectly. For example, processes such as oxide formation and anneal inherently involve exposing partially formed devices to significant concentrations of oxygen, while low-vacuum processes and processes that include water vapor, such as atomic layer deposition (ALD), also subject partially formed memory devices 200 to oxygen exposure. Most materials used to form memory device 200 include trace amounts of oxygen—even films deposited using high-vacuum processes. In addition, during operation of memory device 200, trace oxygen present in the thin film structures making up memory device 200 can migrate over time into memory element 112. Thus, there are many unavoidable sources of oxygen during both fabrication and operation of memory device 200 that facilitate migration of mobile oxygen ions into memory element 112. The migration of mobile oxygen ions into memory element 112 reduces the performance and longevity of memory device 200.

Variable resistance layer 206 in memory element 112 is highly sensitive to oxygen migration during fabrication and/or operation, since the migration of even a very small number of mobile oxygen ions therein can significantly alter the performance memory element 112. Specifically, both the endurance and the reliability of memory element 112 can be reduced by oxygen migration into variable resistance layer 206, where endurance is the number of read-write cycles that can be performed by memory element 112, and reliability is the duration that memory element 112 can retain data.

In light of the above, it is desirable for materials for oxygen barrier layer 501 used in bottom oxygen isolation layer 401 and top oxygen isolation layer 402 to have a structure that is substantially free of migration paths for mobile oxygen and other unwanted ions. Specifically, an ideal oxygen barrier layer, according to embodiments of the invention, comprises a material free of pin holes, grain boundaries between crystals, dislocation lines within crystals, or any other features that can facilitate the introduction of oxygen or other unwanted mobile ions into memory element 112. Furthermore, because bottom oxygen isolation layer 401 and top oxygen isolation layer 402 are included in the film stack making up memory device 200, it is desirable for any oxygen barrier layer 501 used therein to be electrically conductive. In some embodiments, the material and thickness of oxygen barrier layer 501 are selected so that resistance added to memory device 200 by oxygen barrier layer 501 is substantially less than the resistance of variable resistance layer 206 when in the "on" state, i.e., when variable resistance layer 206 is set to low resistance. In one embodiment, the material and thickness of oxygen barrier layer 501 is selected to have no more than about 10% of the resistance of variable resistance layer 206 in the "on" state, so that performance of memory device 200 is not impaired.

In some embodiments, oxygen barrier layer 501 comprises a material having a substantially amorphous structure. In such embodiments, the interface between oxygen barrier layer 501 and adjacent structures in memory device 200 (e.g., bit line electrode 102, top electrode 106, bottom electrode 108, or word line electrode 118) is free of grain boundaries. In this way, no migration pathways are available for oxygen or other unwanted ions to enter memory cell 112 from other regions of memory device 200, and oxygen barrier layer 501 is impermeable to mobile oxygen ions. Because the formation of memory cell 200 generally includes one or more high temperature processes, such as rapid thermal anneal (RTA), it is desirable for the amorphous structure of oxygen barrier layer 501 to withstand temperatures of at least 600° C. without changing to a crystal-containing phase. Suitable materials for oxygen barrier layer 501, when formed as part of bottom oxygen-isolation layer 401 and/or top oxygen-isolation layer 402 include amorphous silicon and refractory metal silicon carbides, such as $Ta_xSi_yC_x$, $W_xSi_yC_x$, and Ta—W—Si—C alloys. It is noted that the term "amorphous," as used herein to describe a material structure, is distinguished from materials having a paracrystalline structure, e.g., micro-crystalline silicon, which are materials that are more ordered than a fully amorphous material and less ordered than a fully crystalline material. A fully amorphous material is substantially free of the grain boundaries that provide pathways for mobile ions, whereas materials having a paracrystalline structure generally include some crystalline structures, the grain boundaries of which can provide pathways for mobile ions.

As noted above, sacrificial layer 502 used in bottom oxygen isolation layer 401 and/or top oxygen isolation layer 402 is a material having a higher reactivity to oxygen than variable resistance layer 206 and other layers making up memory element 112. In addition, it is desirable for sacrificial layer 502 to have an amorphous structure, even after high-temperature processing, to eliminate pathways for oxygen and other mobile ions into memory cell 112. Sacrificial layer 502 may be formed as a separate layer between bit line electrode 102 and top electrode 106, or between bottom electrode 108 and word line electrode 118.

In some embodiments, an amorphous semiconductor material may be used for sacrificial layer 502, such as amorphous silicon. In such embodiments, as sacrificial layer 502 reacts with oxygen, sacrificial layer 502 is converted to an electrically insulative material and therefore has increased resistance. Consequently, in such embodiments, it is desirable for the thickness of sacrificial layer 502 to be minimized, for example on the order of about 20 Å or less. In this way, even if sacrificial layer 502 is largely converted to an insulating material through reaction with oxygen, sacrificial layer 502 is thin enough to be broken down during the forming process, thereby providing conductive paths to variable resistance layer 206 so that operation of memory device 200 is not impaired. In such embodiments, the maximum thickness of sacrificial layer 502 can be selected based on the forming voltage that will be applied to variable resistance layer 206. For typical forming voltages, e.g. 7 V or less, the thickness of sacrificial layer 502 is selected to be 3 to 7 Å or less. In an alternative embodiment, a relatively thick sacrificial layer is initially formed on top electrode 106 as part of top oxygen isolation layer 402, and is then largely or entirely removed prior to the formation of bit line electrode 102. Such an embodiment is described in greater detail below in conjunction with FIG. 5B.

Figure 5A:
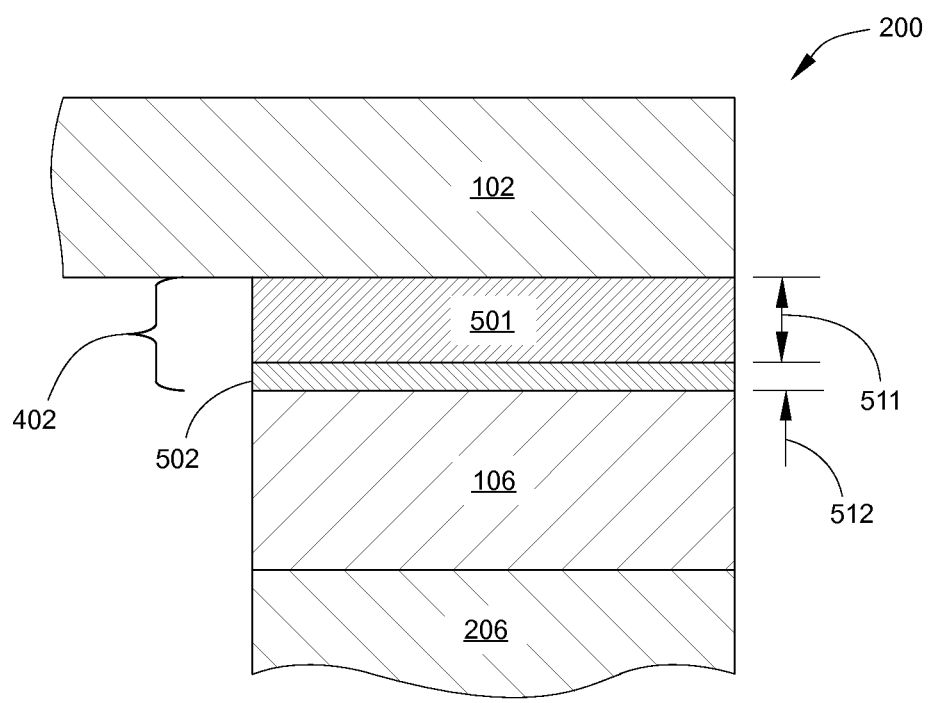
FIGS. 5A and 5B are schematic cross-sectional views of various embodiments of a top oxygen isolation layer in a memory device, as indicated in FIG. 4.
Figure 5B:
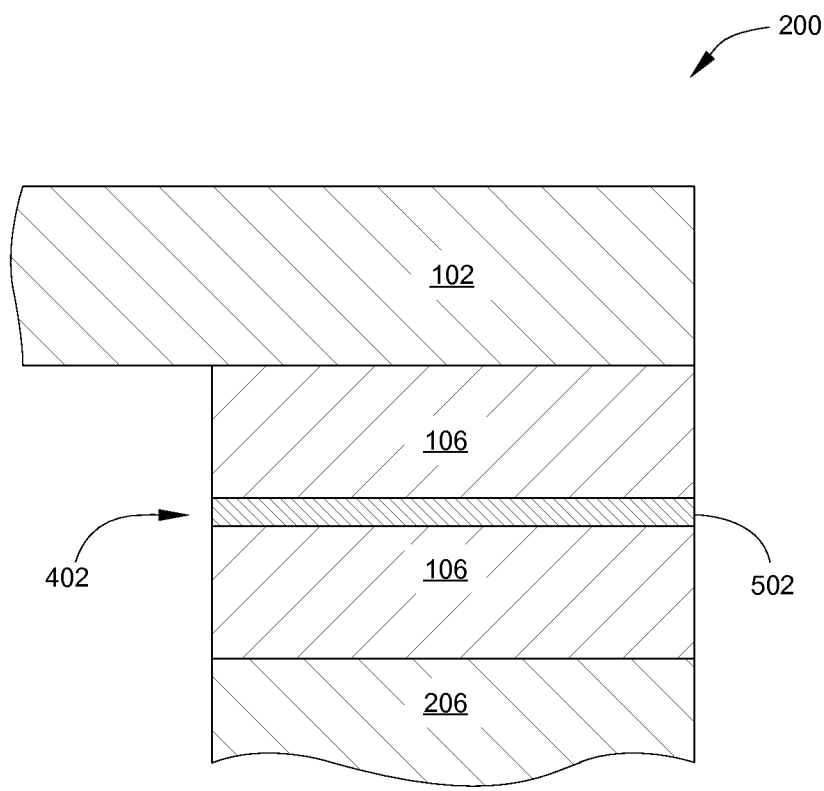

FIGS. 5A and 5B are schematic cross-sectional views of various embodiments of top oxygen isolation layer 402 in memory device 200, as indicated in FIG. 4. One of skill in the art will appreciate that the embodiments of top oxygen isolation layer 402 described in conjunction with FIGS. 5A and 5B can be readily applied to bottom oxygen isolation layer 401 as well without further recitation.

In FIG. 5A, top oxygen isolation layer 402 is disposed between top electrode 106 and top bit line electrode 102 and includes both oxygen barrier layer 501 and sacrificial layer 502. The thickness of oxygen barrier layer 501 can be selected based on the permeability thereof with respect to oxygen and other unwanted mobile ions. It is noted that because oxygen barrier layer 501 is electrically conductive, the thickness 511 of oxygen barrier layer 501 can be configured to be relatively thick without impairing the operation or performance of memory device 200. In this way, oxygen barrier layer 501 can prevent most or all migration of oxygen ions into variable resistance layer 206. In one embodiment, oxygen barrier layer 501 has a thickness 511 of between 5 nm and 50 nm. In contrast, sacrificial layer 502 is relatively thin layer, so that unwanted resistance is not introduced into memory device 200 when the sacrificial layer 502 is partially or wholly converted to an insulative material. The thickness 512 of sacrificial layer 502 can be selected based on the maximum allowable resistance of sacrificial layer 502 if completely converted to an insulating material, such as silicon dioxide ($SiO_2$). In order to minimize unwanted resistance caused by the conversion of sacrificial layer 502 into such an insulating material, and to ensure that a typical forming voltage can break down such an insulating material, in some embodiments thickness 512 may be selected to be no greater than about 3 to 7 Å.

In some embodiments, oxygen barrier layer 501 is formed on top of sacrificial layer 502, as shown FIG. 5A. In such embodiments, oxygen barrier layer 501 is configured to act as a physical barrier for the majority of oxygen ions migrating toward variable resistance layer 206, and sacrificial layer 502 is positioned to react with any oxygen ions that penetrate oxygen barrier layer 501. Because sacrificial layer 502 is relatively thin and has the capacity to react with only a limited number of oxygen ions, an advantage of this embodiment is that sacrificial layer 502 is reserved for stopping the small number of oxygen ions that have penetrated oxygen barrier layer 501.

In the embodiment illustrated in FIG. 5A, oxygen barrier layer 501 is formed on top of sacrificial layer 502, however, other configurations of oxygen barrier layer 501 and sacrificial layer 502 are also contemplated by embodiments of the invention. In one such embodiment, oxygen barrier layer 501 is first formed on top electrode 106, and sacrificial layer 502 is then formed on oxygen barrier layer 501. In another such embodiment, top oxygen isolation layer 402 includes sacrificial layer 502 but does not include oxygen barrier layer 501. In yet another embodiment, top isolation layer 402, includes oxygen barrier layer 501 but does not include sacrificial layer 502.

In some embodiments, sacrificial layer 502 is deposited with an initial thickness that is significantly greater than thickness 512, thereby providing enhanced capacity for protecting variable resistance layer 206 from oxygen during fabrication of memory device 200. The initial thickness 513 of sacrificial layer 502 can be selected based on the estimated quantity of oxygen ions that will migrate into sacrificial layer 502 during fabrication of memory device 200. Such an estimate may include the mean free path traveled by oxygen ions during fabrication of memory device 200 and the concentration of mobile oxygen ions in the bulk material of memory device 200. In such embodiments, sacrificial layer 502 remains in place while oxygen-intensive processes are performed as part of fabricating memory device 200 (e.g., reactive etch processes and processes for the formation of electrically insulating material 410). Then, prior to the formation of bit line electrode 102, most or all of sacrificial layer 502 is removed, so that a thick, electrically insulative layer is not present between top electrode 106 and bit line electrode 102 that can impair operation of memory device 200. In one embodiment, a layer of thickness 512 may be left in place after such removal to protect variable resistance layer 206 during operation.

In FIG. 5B, top oxygen isolation layer 402 includes sacrificial layer 502 embedded inside top electrode 106. In such an embodiment, sacrificial layer 502 may be very thin for the reasons detailed above, for example from 3 to 7 Å. In addition, top oxygen isolation layer 402 may further include oxygen barrier layer 501 formed between top electrode 106 and bit line electrode 102, thereby providing further protection of variable resistance layer 206 from oxygen ion migration.

Figure 6:
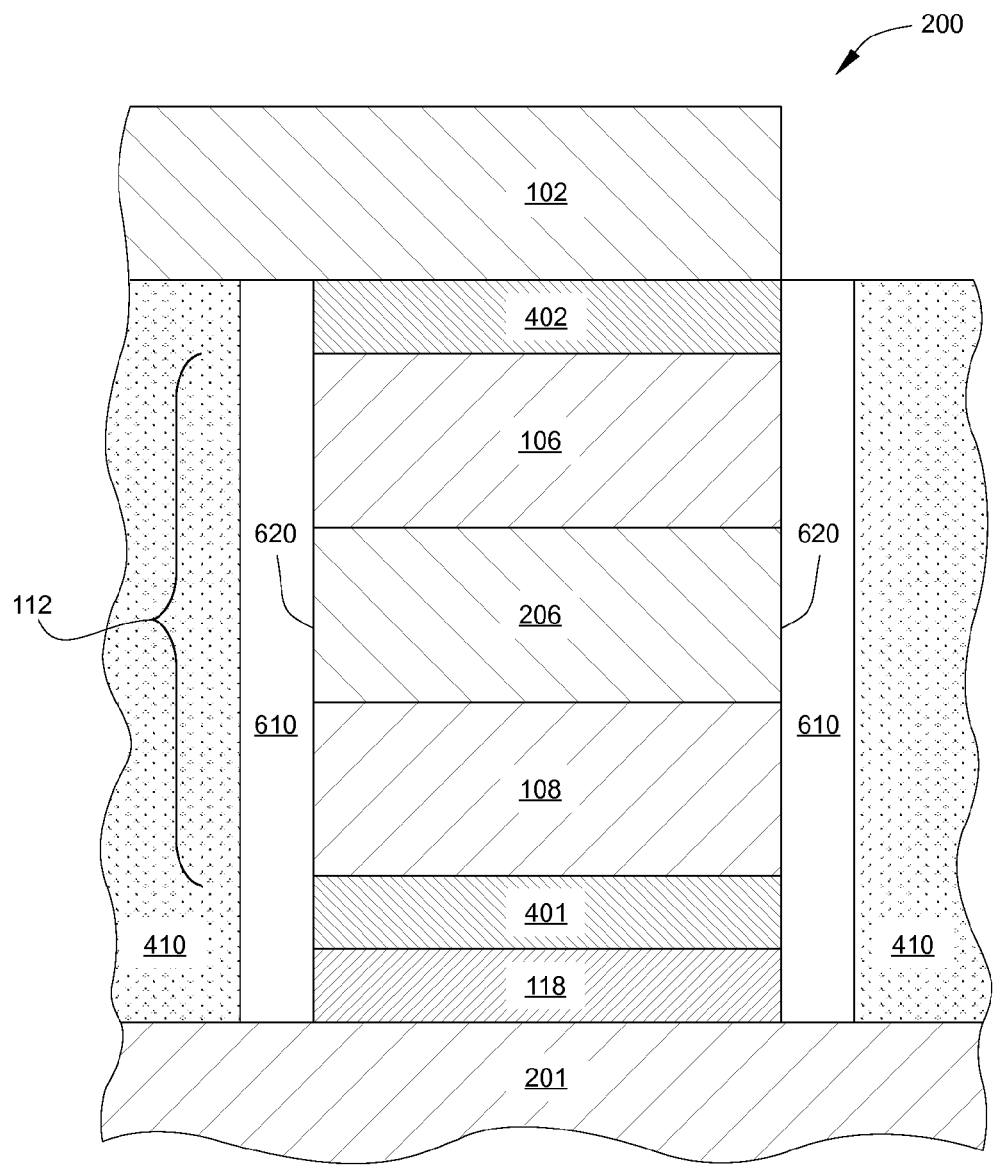
FIG. 6 is a schematic cross-sectional view of a memory device formed with oxygen barrier layers formed on sidewalls of a memory element, according to an embodiment of the invention.

FIG. 6 is a schematic cross-sectional view of memory device 200 formed with oxygen isolation layers 610 formed on sidewalls 620 of memory element 112, according to an embodiment of the invention. The embodiment of memory device 200 illustrated in FIG. 6 is substantially similar in organization and operation to the embodiment illustrated in FIG. 4, with the addition of oxygen isolation layers 610 formed on sidewalls 620 of memory element 112.

Oxygen isolation layers 610 are configured to further isolate memory cell 112 from oxygen migration without affecting the operation of memory device 200. To that end, oxygen isolation layers 610 comprise materials that are not oxygen-containing and do not form a significant current path around memory element 112, i.e., from bit line electrode 102 to word line electrode 118. In order to prevent such a current path, oxygen isolation layers 610 have significantly higher resistance relative to memory element 112, and consequently are formed from different materials than bottom oxygen isolation layer 401 and top oxygen isolation layer 402. Furthermore, oxygen isolation layers 610 can have no resistive switching properties. Oxygen isolation layers 610 may include an oxygen barrier layer, a sacrificial layer, or a combination of both.

Suitable oxygen barrier layers for oxygen isolation layers 610 have an amorphous structure after high-temperature processes and have relatively high electrical resistivity. In addition, suitable oxygen barrier layers for oxygen isolation layers have higher oxygen affinity than the materials in memory cell 112. In one embodiment, oxygen isolation layer 610 includes silicon nitride ($Si_3N_4$) or tetraethyl orthosilicate (TEOS, or $Si(OC_2H_5)_4$). Suitable sacrificial layer materials for oxygen isolation layers 610 include materials that is more reactive with oxygen than the materials in memory cell 112. Ideally, the sacrificial layer in oxygen isolation layers 610 also maintains an amorphous structure after high-temperature processes. For example, in one embodiment, oxygen isolation layers 610 each include a layer of amorphous silicon, which is highly reactive with oxygen and has an amorphous structure. In one such embodiment, an oxygen barrier layer is positioned between memory element 112 and the sacrificial layer.

Figure 7:
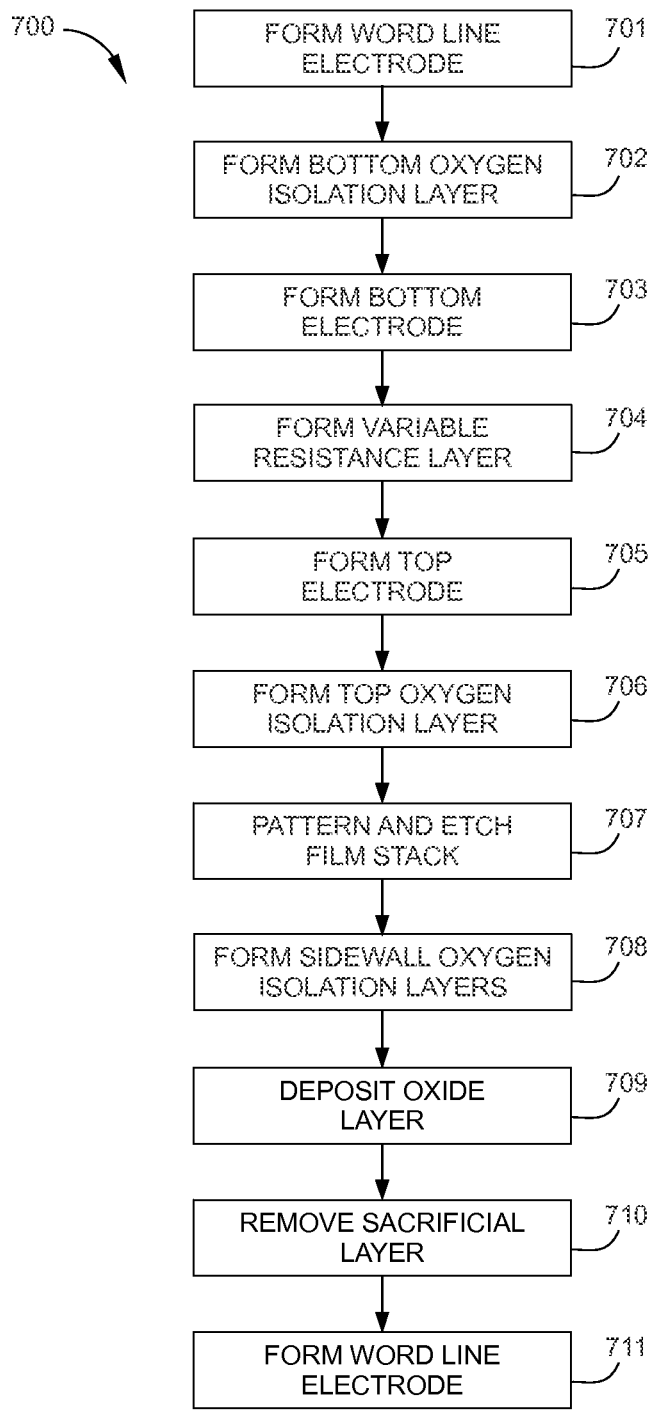
FIG. 7 sets forth a flowchart of method steps in a process sequence for forming a memory device, according to embodiments of the invention.

FIG. 7 sets forth a flowchart of method steps in a process sequence 700 for forming memory device 200, according to embodiments of the invention. Although the method steps are described in conjunction with memory device 200 in FIG. 6, persons skilled in the art will understand that formation of other resistive switching memory devices using process sequence 700 is within the scope of the invention.

As shown, method 700 begins at step 701, in which word line electrode 118 is formed. In one embodiment, word line electrode 118 is a highly doped polysilicon layer that is formed on substrate 201 using a conventional CVD or ALD type polysilicon deposition technique, and is between about 50 Å and about 5000 Å thick.

In step 702, bottom oxygen isolation layer 401 is formed on word line electrode 118 using a deposition process or processes appropriate to the configuration of bottom oxygen isolation layer 401. For example, in embodiments in which bottom oxygen isolation layer 401 includes an amorphous silicon layer as a sacrificial layer, a chemical vapor deposition (CVD) process can be used. In embodiments in which bottom oxygen isolation layer 401 includes a refractory metal silicon carbide as an oxygen barrier layer, such as $Ta_xSi_yC_x$, a DC magnetron co-sputtering process can be used. In one such embodiment, a $Ta_{40}W_{40}Si_{10}C_{10}$ thin film can be deposited using three-target dc-magnetron co-sputtering with tantalum, tungsten (W) and silicon carbide (SiC) targets. In some embodiments, a sacrificial layer may be formed on top of oxygen barrier layer 501 to be positioned closer to variable resistance layer 206.

In step 703, bottom electrode 108 is formed on bottom oxygen isolation layer 401 using a deposition process or processes appropriate to the materials included in bottom electrode 108. For example, when bottom electrode 108 is a highly doped polysilicon layer, a conventional CVD or ALD type polysilicon deposition technique may be used to form bottom electrode 108 with a thickness that is between about 50 and about 5000 Å.

In step 704, variable resistance layer 206 is deposited on the bottom electrode 108 using an appropriate deposition process. For example, when variable resistance layer 206 comprises a metal oxide layer, such as $Hf_xO_y$, $Ta_xO_y$, $Al_xO_y$, $La_xO_y$, $Y_xO_y$, $Dy_xO_y$, $Yb_xO_y$ and/or $Zr_xO_y$, formed to a thickness of between about 20 and about 100 Å, variable resistance layer 206 can be deposited using an ALD process well-known in the art. In other embodiments, variable resistance layer 206 can be deposited using a CVD process, such as low-pressure CVD (LPCVD) or plasma-enhanced (PECVD), physical vapor deposition (PVD) processes, liquid deposition processes, or epitaxy processes. In one embodiment, an ALD process using tetrakis(dimethylamino)hafnium (TDMAH) and an oxygen-containing precursor at a temperature of about 250° C. is used to form a 50 Å thick, hafnium oxide ($Hf_xO_y$) containing variable resistance layer 206.

In step 705, top electrode 106 is formed on variable resistance layer 206 using a deposition process or processes appropriate to the materials included in top electrode 106, including PVD, CVD, ALD or other similar processes. In one example, a PVD process is used to form electrode 102 that comprises titanium nitride (TiN) and is between about 100 Å and 1000 Å thick.

In step 706, top oxygen isolation layer 402 is formed on top electrode 106 using a deposition process or processes appropriate to the configuration of top oxygen isolation layer 402. Similar processes described above in step 702 for bottom oxygen isolation layer 401 may be used in step 706.

It is noted that the processes described in steps 701-706 form blanket layers of different materials on substrate 201. In step 707, the film stack deposited in steps 701-706 is patterned and etched using standard techniques known in the art to form the individual memory devices 200 of memory array 100.

In step 708, oxygen isolation layers 610 are formed on sidewalls 620 of memory element 112 using a deposition process or processes appropriate to the configuration of top oxygen isolation layer 402. In some embodiments, a conformal process is used to deposit a silicon nitride ($Si_3N_4$) layer as an oxygen barrier layer. In such embodiments, a CVD process can be used to provide adequate step coverage of sidewalls 620. In one such embodiment, a sacrificial layer is then deposited on oxygen barrier layer 501, such as an amorphous silicon layer.

In step 709, electrically insulating material 410 is deposited as shown to passivate and protect the memory devices 200 of memory array 100. In some embodiments, a CVD oxide deposition process is used. It is noted that the presence of bottom oxygen isolation layer 401, top oxygen isolation layer 402, and oxygen isolation layers 610 helps prevent oxygen migration into memory cell 112 during step 709.

In step 710, in embodiments in which a thick sacrificial layer is formed on top electrode 106, a suitable material removal process is used to largely or completely remove sacrificial layer 502. A wet oxide etch process, a dry etch process, or a chemical-mechanical polishing (CMP) process may be used to perform step 710. In some embodiments, the thickness of the remaining portion of sacrificial layer 502 is between about 3 to 7 Å. In other embodiments, sacrificial layer 502 is entirely removed.

In step 711, bit line electrode 102 is deposited on electrically insulating material 410 and top oxygen isolation layer 402 as shown. In some embodiments, bit line electrode 102 is deposited as a blanket film with an appropriate deposition process, and is then patterned and etched to form bit line electrodes 102 of memory array 100. In some embodiments, bit line electrode 102 includes a metallic conductor, and is deposited using any technically feasible metal deposition process known in the art.

While embodiments of the invention are described herein in terms of memory device 200 and resistive switching memory elements that are used to form memory arrays, embodiments of the present invention can be applied to other resistive memory devices without exceeding the scope of the invention described herein. Thus, other configurations of resistive memory device may also benefit from embodiments of the invention.

In sum, embodiments of the invention provide a nonvolatile resistive memory element having one or more novel oxygen isolation structures and methods of forming the same. Use of the oxygen isolation structures advantageously improves performance and longevity of the nonvolatile resistive memory element by preserving defects in the resistive switching material, such as oxygen vacancies, that are responsible for the switching capability of the resistive switching material.

In some embodiments of the present invention, methods of forming a nonvolatile memory element in a ReRAM device are described below.

AA: A method of forming a nonvolatile memory element in a ReRAM device, the method comprising:
  forming a first layer operable as a variable resistance layer above a second layer operable as an electrode layer;
  forming a third layer operable as an electrode layer, so that the first layer is ultimately disposed between the second layer and the third layer; and
  forming a fourth layer operable as an oxygen isolation layer above the third layer.

AB: The method of AA, wherein forming the fourth layer above the third layer comprises forming a sacrificial layer that is more reactive with oxygen than the second layer.

AC: The method of AA, wherein forming the fourth layer above the third layer comprises forming an oxygen barrier layer that comprises a material having an amorphous structure and an electrical resistance that is less than the electrical resistance of the variable resistance layer in a low-resistance state.

AD: The method of AC, wherein the oxygen barrier layer comprises a material from the group of alloys consisting of $Ta_xSi_yC_x$, $W_xSi_yC_x$, and Ta—W—Si—C.

AE: The method of AA, further comprising forming a fifth layer operable as an oxygen isolation layer on a sidewall of the first layer.

AF: The method of AE, wherein the fifth layer comprises a material from the group of materials consisting of silicon nitride ($Si_3N_4$), tetraethyl orthosilicate (TEOS, $Si(OC_2H_5)_4$), and amorphous silicon.

BA: A method of forming a nonvolatile memory element in a ReRAM device, the method comprising:
  forming a first layer operable as an oxygen isolation layer on a substrate;
  forming a second layer operable as an electrode layer above the first layer; forming a third layer operable as a variable resistance layer above the second layer; and
  forming a fourth layer operable as an electrode layer, so that the third layer is ultimately disposed between the second layer and the fourth layer.

BB: The method of BA, wherein forming an oxygen isolation layer on the substrate comprises forming a sacrificial layer that is more reactive with oxygen than the variable resistance layer.

BC: The method of BB, wherein the sacrificial layer comprises amorphous silicon.

BD: The method of BA, wherein forming the first layer on the substrate comprises forming an oxygen barrier layer that comprises a material having an amorphous structure and an electrical resistance that is less than the electrical resistance of the third layer when the third layer is in a low-resistance state.

BE: The method of BD, wherein the electrical resistance of the oxygen barrier layer is equal to or less than about 10% of the electrical resistance of the third layer when the third layer is in a low-resistance state.

BF: The method of BA, further comprising forming a fifth layer operable as an oxygen isolation layer on a sidewall of the third layer.

CA: A method of forming a nonvolatile memory element in a ReRAM device, the method comprising:
  forming a first layer operable as a variable resistance layer above a second layer operable as an electrode layer;
  forming a first portion of a third layer operable as an electrode layer, so that the first layer is disposed between the second layer and the first portion of the third layer;
  forming a fourth layer operable as a sacrificial layer on the first portion of the third layer, wherein the fourth layer comprises a material that is more reactive with oxygen than a material in the first layer; and
  forming a remainder portion of the third layer on the fourth layer.

CB: The method of CA, wherein the fourth layer comprises amorphous silicon.

CC: The method of CA, wherein the fourth layer has a thickness no greater than about 7 Å.

CD: The method of CA, further comprising forming a fifth layer operable as an oxygen isolation layer on a sidewall of the first layer.

DA: A method of forming a nonvolatile memory element in a ReRAM device, the method comprising:
  forming a first layer operable as a variable resistance layer above a second layer operable as an electrode layer;
  forming a third layer operable as an electrode layer, so that the first layer is ultimately disposed between the second layer and the third layer; and
  forming a fourth layer operable as an oxygen isolation layer on a sidewall of the first layer.

DB: The method of DA, wherein forming the fourth layer comprises exposing the sidewall of the first layer by etching portions of the first, second, and third layers.

DC: The method of DA, wherein the fourth layer comprises a material selected from the group of materials consisting of silicon nitride ($Si_3N_4$), tetraethyl orthosilicate (TEOS, $Si(OC_2H_5)_4$), and amorphous silicon.

While the foregoing is directed to embodiments of the present invention, other and further embodiments of the invention may be devised without departing from the basic scope thereof, and the scope thereof is determined by the claims that follow.

We claim:
1. A nonvolatile memory element, comprising:
  a first layer operable as an electrode layer and formed above a substrate;
  a second layer operable as a variable resistance layer and disposed between the first layer and a third layer operable as an electrode layer;

a fourth layer that is operable as a first oxygen barrier layer disposed between the first layer and the substrate, the fourth layer being configured to prevent the depletion of oxygen vacancies from the first layer; and a fifth layer that is operable as a second oxygen barrier layer disposed above the third layer, the fifth layer being operable to prevent the depletion of oxygen vacancies from the third layer, wherein the fourth layer and the fifth layer comprise a material having an amorphous structure, the material comprising amorphous silicon and refractory metal silicon carbides, wherein the fourth layer interfaces a bottom surface of the first layer, wherein the fourth layer comprises a sixth layer that is operable as a sacrificial layer and comprises a material that is more reactive with oxygen than a material in the second layer, and wherein the fifth layer interfaces a top surface of the third layer such that the first layer, second layer, and third layer are formed between the fourth layer and the fifth layer.

2. The nonvolatile memory element of claim 1, wherein the fourth layer has an electrical resistance that is less than the electrical resistance of the second layer when the second layer is in a low-resistance state.

3. The nonvolatile memory element of claim 2, wherein the electrical resistance of the fourth layer is equal to or less than about 10% of the electrical resistance of the second layer when the second layer is in a low-resistance state.

4. The nonvolatile memory element of claim 1, wherein the fourth layer comprises a material selected from the group of alloys consisting of tantalum silicon carbide and tungsten silicon carbide.

5. A nonvolatile memory element, comprising:
a first layer operable as an electrode layer and formed above a substrate;
a second layer operable as a variable resistance layer and disposed between the first layer and a third layer operable as an electrode layer;
a fourth layer that is operable as a first sacrificial layer disposed between the first layer and the substrate,
wherein the fourth layer comprises a material that is more reactive with oxygen than a material in the second layer;
a fifth layer that is operable as a first oxygen barrier layer and that is disposed between the fourth layer and the substrate, the fourth layer being configured to prevent the depletion of oxygen vacancies from the first layer;

a sixth layer that is operable as a second sacrificial layer disposed above the third layer, wherein the sixth layer comprises a material that is more reactive with oxygen than a material in the second layer; and a seventh layer that is operable as a second oxygen barrier layer and that is disposed above the sixth layer, the seventh layer being configured to prevent the depletion of oxygen vacancies from the third layer, wherein the fifth layer and the seventh layer comprise a material having an amorphous structure, the material comprising amorphous silicon and refractory metal silicon carbides, wherein the fourth layer interfaces a bottom surface of the first layer, wherein the fifth layer interfaces a bottom surface of the fourth layer, wherein the sixth layer interfaces a top surface of the third layer, and wherein the seventh layer interfaces a top surface of the sixth layer such that the first layer, second layer, and third layer are formed between the fourth layer and the sixth layer.

6. The nonvolatile memory element of claim 5, wherein the fourth layer comprises amorphous silicon.

7. The nonvolatile memory element of claim 5, wherein the fourth layer has a thickness no greater than about 7 Å.

8. The nonvolatile memory element of claim 1, wherein the fifth layer comprises a material having an amorphous structure and an electrical resistance that is less than the electrical resistance of the second layer when the second layer is in a low-resistance state.

9. The nonvolatile memory element of claim 8, wherein the electrical resistance of the fifth layer is equal to or less than about 10% of the electrical resistance of the second layer when the second layer is in a low-resistance state.

10. The nonvolatile memory element of claim 1 further comprising a word line electrode disposed between the fourth layer and the substrate.

11. The nonvolatile memory element of claim 1 further comprising a bit line electrode disposed above the fifth layer.

12. The nonvolatile memory element of claim 5 further comprising a word line electrode disposed between the fifth layer and the substrate.

13. The nonvolatile memory element of claim 5 further comprising a bit line electrode disposed above the seventh layer.

* * * * *